(12) United States Patent
Na

(10) Patent No.: US 6,188,616 B1
(45) Date of Patent: Feb. 13, 2001

(54) SEMICONDUCTOR MEMORY DEVICE HAVING A COMPENSATING WRITE PULSE WIDTH IN RESPONSE TO POWER SUPPLY VOLTAGE

(75) Inventor: Joon Ho Na, Chungcheongbuk-do (KR)

(73) Assignee: Hyundai Electronics Industries Co., Ltd., Ichon-shi (KR)

(*) Notice: Under 35 U.S.C. 154(b), the term of this patent shall be extended for 0 days.

(21) Appl. No.: 09/198,273

(22) Filed: Nov. 24, 1998

(30) Foreign Application Priority Data

Dec. 27, 1997 (KR) .................................................. 97/75402

(51) Int. Cl.[7] ...................................................... G11C 7/00
(52) U.S. Cl. .................... 365/194; 365/191; 365/189.01; 365/189.05; 365/233
(58) Field of Search .................................... 365/194, 191, 365/189.01, 233, 189.05

(56) References Cited

U.S. PATENT DOCUMENTS

| | | | |
|---|---|---|---|
| 4,764,900 | 8/1988 | Bader et al. | 365/189 |
| 5,576,996 | * 11/1996 | Awaya et al. | 365/189.01 |
| 5,592,429 | * 1/1997 | Hirata | 365/226 |
| 5,742,558 | * 4/1998 | Hashimoto | 365/233.5 |
| 5,864,509 | * 1/1999 | Anumula | 365/194 |
| 5,867,447 | * 2/1999 | Koshikawa | 365/194 |
| 5,889,728 | * 3/1999 | Rezeanu | 365/194 |

\* cited by examiner

*Primary Examiner*—Amir Zarabian
*Assistant Examiner*—VanThu Nguyen
(74) *Attorney, Agent, or Firm*—Fleshner & Kim, LLP

(57) ABSTRACT

A semiconductor memory device according to the present invention includes a write pulse width timing compensating part that controls a write pulse width timing. The semiconductor memory controls the point of disabling a write control drive signal by directly producing a write enable signal or delaying the write enable signal based on a level of a power supply voltage to compensate the write pulse width timing. The write pulse width timing compensating part receives the poser supply level and the write enable signal and outputs a compensated write control drive signal. A generating part receives the write control drive signal from the write pulse width timing compensating part, a selection signal, and a decoder signal and generates a control signal. A data input part writes input data to a selected cell upon application of data and the control signal from the generating part.

33 Claims, 6 Drawing Sheets

SEMICONDUCTOR MEMORY DEVICE HAVING A COMPENSATING WRITE PULSE WIDTH IN RESPONSE TO POWER SUPPLY VOLTAGE

BACKGROUND OF THE INVENTION

1. Field of the Invention

The present invention relates to a semiconductor memory device, and in particular, to a semiconductor memory device that determines a write pulse width timing.

2. Background of the Related Art

FIG. 1 is a block diagram showing a related art semiconductor memory device. The related art semiconductor memory device includes a WCD signal generating part 11 outputting a logical product, which is a write control driving signal WCD, upon application of a write enable signal WET from a pad PAD (not shown). A WCDN generating part 13 produces a signal WCDN for controlling a data input part upon receipt of the WCD signal, a chip selection signal CS, and a signal Z-DEC. A data input part 15 outputs a logical product, which is high-level data and low-level data, to a corresponding memory cell upon application of the write enable signal WET from the pad PAD.

The signal Z-DEC informs the WCDN generating part 13 which cell of cells defined by blocks is selected. The WCD signal generating part 11 includes an inverter INT1 inverting the applied write enable signal WET, and an inverter INT2 inverting a signal output from inverter INT1. A NAND gate NAND1 outputs a logical product of an output signal of inverter INT2 and write enable signal WET, and an inverter INT3 inverts an output signal of the NAND gate NAND1.

The data input part 15 includes an inverter INT4 inverting applied data, a NOR gate NOR1 performing a NOR operation with respect to an output signal of inverter INT4 and the WCDN signal, and a NOR gate NOR2 performing a NOR operation with respect to the applied data signal and the WCDN signal. Inverters INT5 and INT6 respectively invert an output signal of each of the NOR gates NOR1 and NOR2, and an inverter INT7 inverts an applied signal CWEN. A transfer gate TG1 is interposed between input and output terminals of the inverter INT7, and a transfer gate TG2 is connected in series to the transfer gate TG1.

The transfer gate TG1 produces high-level data, and the transfer gate TG2 outputs low-level data. The signal CWEN is a control signal and serves to turn on transfer gates TG1 and TG2 when storing data in a cell.

The operation of the related art memory device will now be described. As shown in FIGS. 2A–2E, the WCD signal generating part 11 generates the write control driving signal WCD upon application of the write enable signal WET from the pad PAD. When comparing the point of disabling write enable signal WET to that of disabling write control drive signal WCD, there exists a delay time td. The write control driving signal WCD is an internal enable signal WCD necessary for writing data to a cell. Thus, the width of write control driving signal WCD and the points (i.e., timing) of enabling and disabling the WCD signal are important.

The WCDN generating part 13 transmits the signal WCDN to the data input part 15 upon application of the signals WCD and Z-DEC, which is not depicted in FIG. 2. The data input part 15 writes data to a selected cell under control of the signal WCDN. Accordingly, it is necessary to either advance the point of enabling signal WCD or delay the point of disabling signal WCD to improve the accuracy and speed of the write pulse timing. Delaying the point of the disabling signal WCD causes a delay in the point of disabling the signal WCDN, which adversely affects the write recovery timing. As described above, the write pulse width timing (WPT) may be improved by advancing the point of enabling signal WCD but this technique also has a restriction. The enabling point cannot be advanced too much because of the address setup time. In conclusion, the point of writing data to a cell equals the time when the WCDN generating part 13 produces the signal WCDN on receipt of the signal WCD.

In a case where the power supply voltage transitions to a low level, the point of disabling signal WCD cannot be delayed. In repetition of data write and data read, it is required to disable the signal WCD as soon as possible. Otherwise, the data write timing changes to the data read timing even though writing data to a cell is not completely finished. Thus, delaying the point of the disabling signal WCD adversely affects the write recovery timing.

The above-described related art semiconductor memory device has various disadvantages. In the related art semiconductor memory device there is a time margin or period in the write recovery timing when the power supply voltage attains a low level compared to when the power supply voltage attains a high level, and it is necessary to advance the point of enabling signal WCD in order to compensate for a write pulse width timing (TWP). However, there is a limit to advancing the point of enabling signal WCD because of the address setup timing, which makes it impossible to realize a high speed static random access memory. Further, in the related art device, the points of enabling and disabling signal WCD are not controlled according to the power supply voltage level, which reduces the efficiency of the semiconductor memory device.

The above references are incorporated by reference herein where appropriate for appropriate teachings of additional or alternative details, features and/or technical background.

SUMMARY OF THE INVENTION

An object of the present invention is to provide a semiconductor memory device that substantially obviates one or more of the problems caused by limitations and disadvantages of the related art.

Another object of the present invention is to provide a semiconductor memory device that increases a write pulse width timing efficiency.

Another object of the present invention is to provide a semiconductor memory device for a high speed static random access memory.

Another object of the present invention is to provide a semiconductor memory device that determines write pulse width timing based on high or low level power supply voltage characteristics when writing data.

Another object of the present invention is to provide a semiconductor memory device that delays a write control signal timing when the power supply voltage attains a low level, and advances the write control signal timing when the power supply voltage attains a high level.

To achieve at least these objects and other advantages in a whole or in parts, and in accordance with the purpose of the present invention, as embodied and broadly described, a semiconductor device of the present invention includes a write pulse width compensating circuit that compensates a write control drive signal based on a power supply voltage, a first generating circuit that receives the write control drive signal, a first selection signal and a second selection signal and outputs a control signal for a selected cell and a data input circuit that receives data and writes the data to the selected cell based on application of the data and the control signal.

To further achieve these objects and other advantages in a whole or in parts, a write pulse width compensating circuit is provided according to the present invention that includes a write enable delay circuit that receives a write enable signal and outputs a delayed write enable signal, a voltage sensing circuit that determines a power supply voltage and outputs a delay selection signal and a generating circuit that receives the delayed write enable signal, the write enable signal and the delay selection signal and produces a write control drive signal based on the power supply voltage.

To further achieve these objects and other advantages in a whole or in parts, a write pulse width compensating circuit is provided according to the present invention that includes a first transistor with a control electrode receiving a chip enable signal and a second electrode coupled to the power supply voltage, a transfer gate enabled by an output signal of the voltage sensing circuit, an second transistor with a control electrode that receives the power supply voltage and a first electrode coupled to a ground voltage, a first logic gate that logically processes the write enable signal and an output signal of the transfer gate, wherein the output signal of the transfer gate is regulated by the second transistor, a delay circuit coupled in series to an output terminal of the first logic-gate to delay an output signal of the first logic-gate, and a second logic-gate that logically processes an output signal of the first logic-gate and an output signal of the delay circuit to output the write control signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
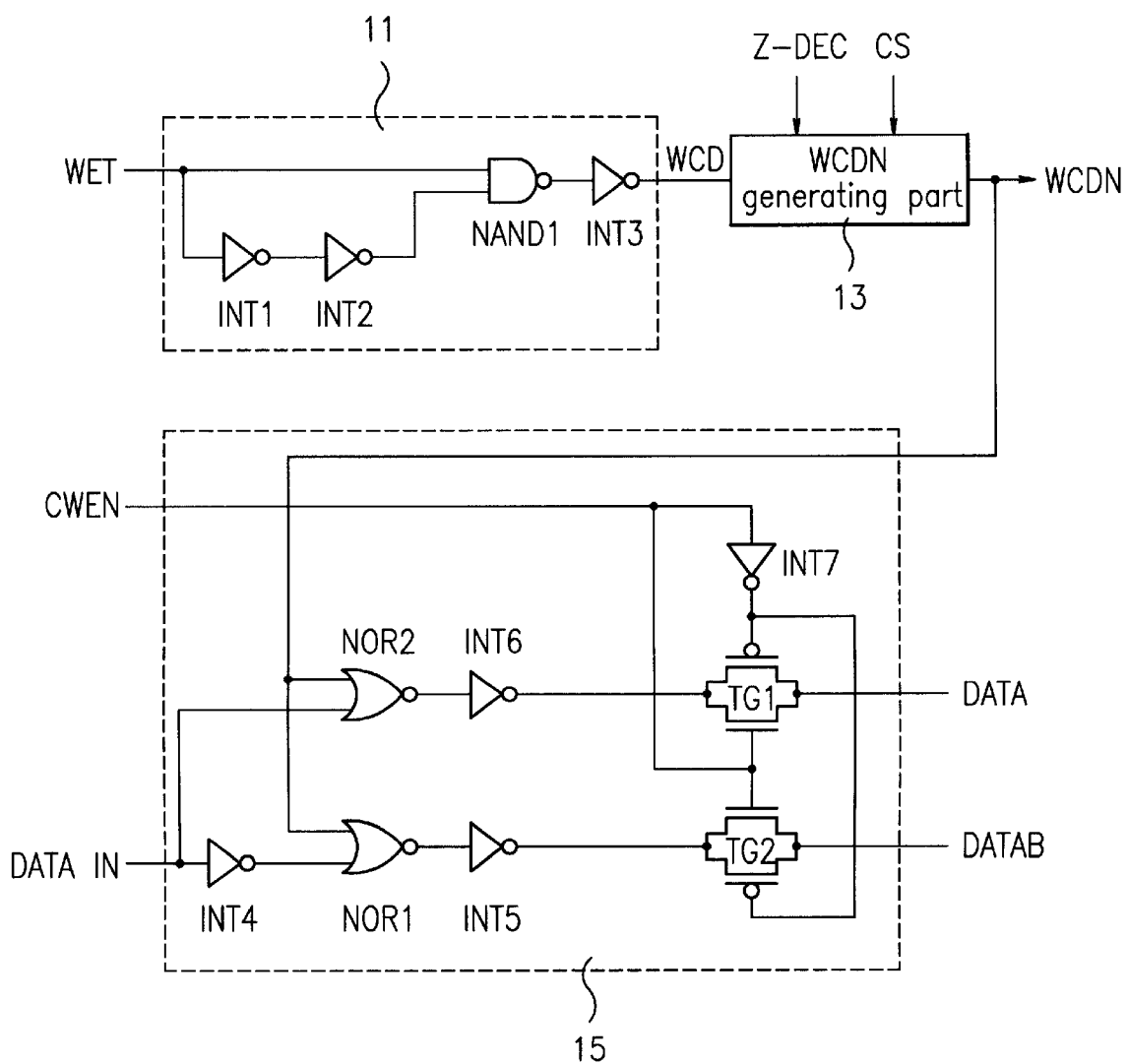
FIG. 1 is a circuit diagram showing a related art semiconductor memory device.
Figure 2:
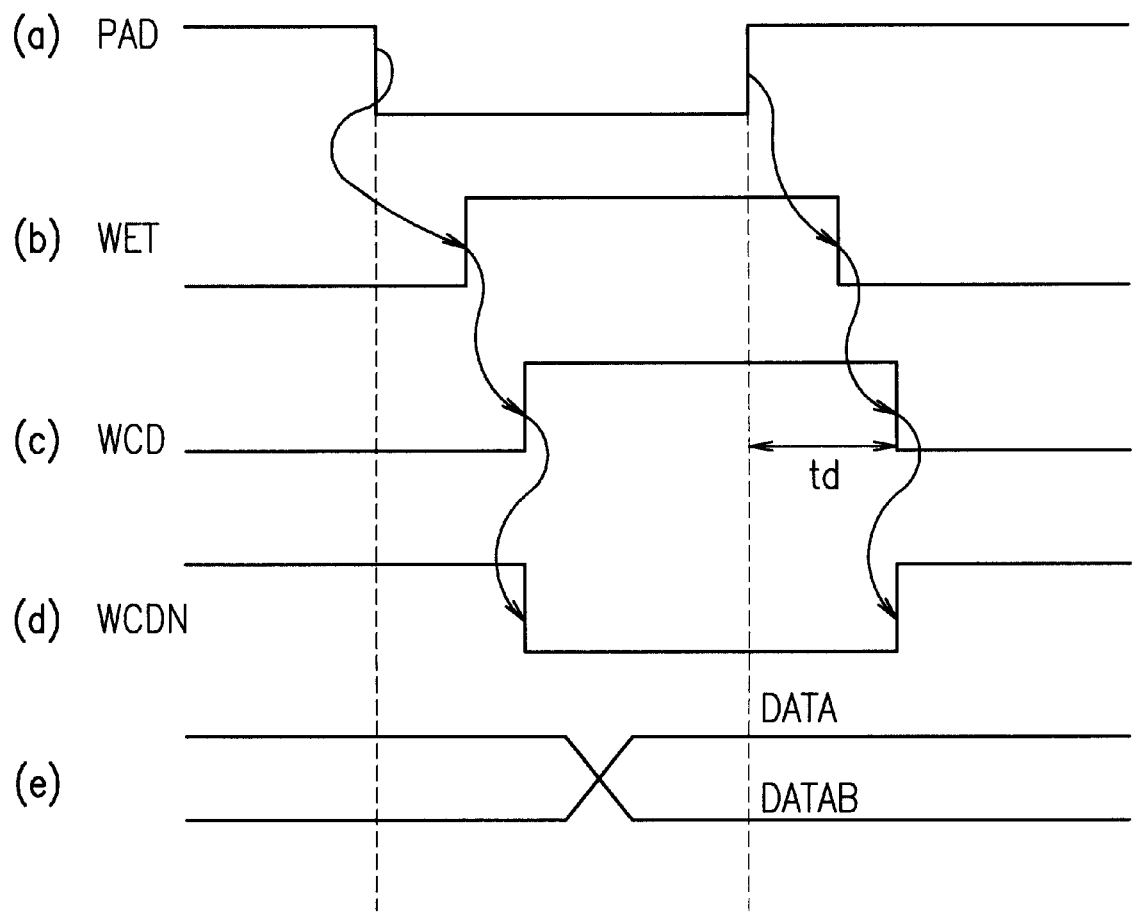
FIGS. 2A–2E are diagrams showing signal timing of the related art semiconductor memory device.
Figure 3:
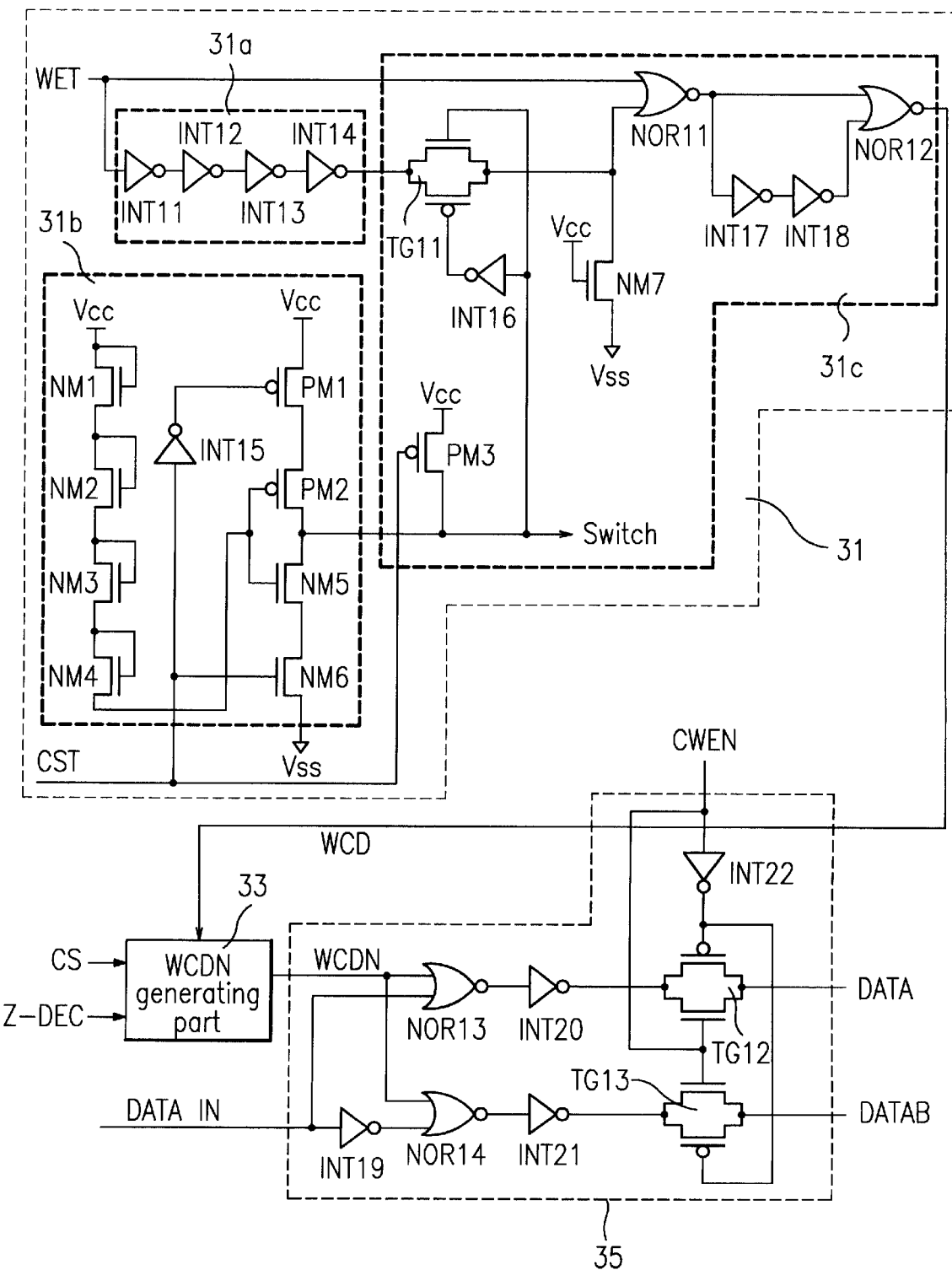
FIG. 3 is a circuit diagram showing a preferred embodiment of a semiconductor memory device in accordance with the present invention.
Figure 4:
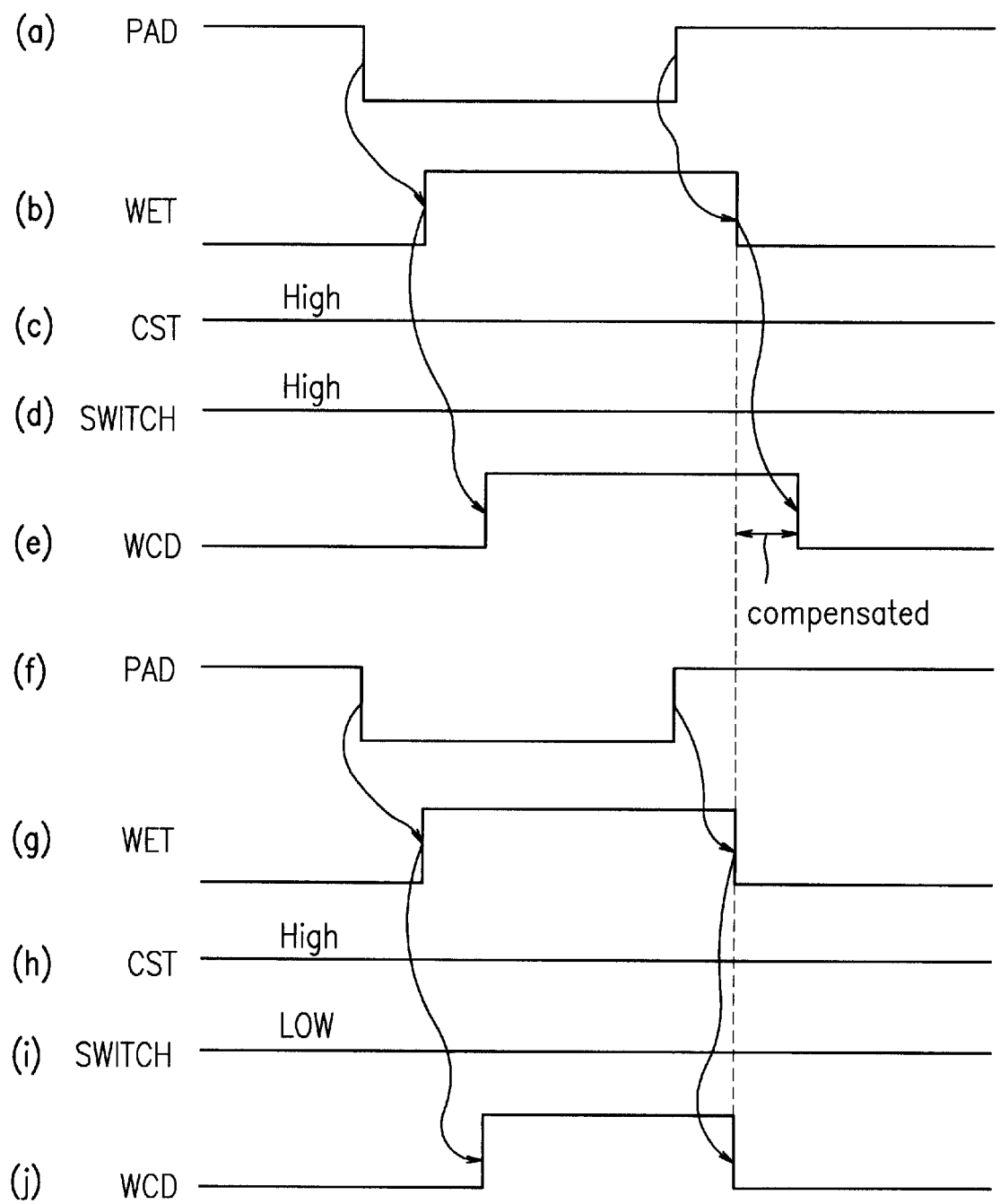
FIGS. 4A–4J are diagrams showing signal timing of the semiconductor memory device of FIG. 3.

FIG. 3 is a circuit diagram of a preferred embodiment of a semiconductor memory device in accordance with the present invention. The preferred embodiment of a semiconductor memory device includes a write pulse width timing (TWP) compensating part 31, a WCDN generating part 33 and a data input part. The TWP compensating part 31 compensates for the write pulse width timing (TWP) upon application of a write enable signal WET from a pad PAD (not shown) and produces a signal WCD (e.g., a write control driving signal). The WCDN generating part 33 produces a signal WCDN for controlling a data input part upon receipt of the signal WCD from the TWP compensating part 31, a chip selection signal CS, and a signal Z-DEC. The data input part 35 writes data to a selected cell upon application of the signal WCDN.

The TWP compensating part 31 includes a WET delay 31a, a power supply voltage sensing part 31b, and a WCD signal generating part 31c. The WET delay 31a includes an inverter INT11 inverting the write enable signal WET applied from the pad PAD, and inverters INT12, INT13 and INT14 coupled in series with the inverter INT11 and inverting an output signal of each of the preceding inverters. The inverters INT11, INT12, INT13 and INT14 delay the WET signal for a predetermined period of time. Accordingly, it is important to determine the number of inverters according to the predetermined delay time.

The power supply voltage sensing part 31b includes four NMOS transistors NM1, NM2, NM3 and NM4 coupled in series to a power supply voltage Vcc, and an inverter INT15 for inverting an applied chip enable signal CST. A PMOS transistor PM1 has a gate receiving an output of the inverter INT15 and a drain to which the power supply voltage Vcc is applied. A PMOS transistor PM2 has a drain coupled to a source of the PMOS transistor PM1 and a gate receiving an output signal of the NMOS transistor NM4. The power supply voltage sensing part 31b also includes an NMOS transistor NM5 coupled in series with the PMOS transistor PM2 with a gate receiving the output signal of NMOS transistor NM4. In addition, an NMOS transistor NM6 is coupled in series to the NMOS transistor NM5 with a gate receiving the chip enable signal CST and a source coupled to ground Vss.

The WCD signal generating part 31C includes a PMOS transistor PM3 with a gate receiving the chip enable signal CST and a drain and a source respectively coupled to the power supply voltage Vcc and an output terminal of the PMOS transistor PM2. A transfer gate TG11 selectively produces an output signal of the WET delay 31a using an output signal of PMOS transistor PM3 and its inverse respectively received from an inverter INT16. An NMOS transistor NM7 is turned on by the power supply voltage Vcc and has a source and a drain respectively coupled to ground and the transfer gate TG1 output terminal. A NOR gate NOR11 performs a NOR operation with respect to the write enable signal WET and an output signal of the transfer gate TG11 whose level is regulated by the NMOS transistor NM7. An inverter INT17 inverts an output of the NOR gate NOR11 and an inverter INT18 inverts an output of the inverter INT17. A NOR gate NOR12 performs a NOR operation with respect to the output signals of the inverter INT18 and the NOR gate NOR11.

If an output signal of PMOS transistor PM3 goes "high" or "low", the power supply voltage attains a low level and a high level, respectively. That is, in the preferred embodiment of the semiconductor memory device, power supply voltage sensing part 31b senses if the power supply voltage attains a high or low level to compensate the write pulse width timing (TWP).

The data input part 35 includes a NOR gate NOR13 performing a NOR operation with respect to a data signal DATA IN, which is preferably externally applied, and an output signal WCDN of the WCDN generating part 33. An inverter INT19 inverts the data signal, and a NOR gate NOR14 performs a NOR operation with respect to an output signal of inverter INT19 and the signal WCDN. An inverter INT20 inverts an output signal of the NOR gate NOR13, and an inverter INT21 inverts an output signal of the NOR gate NOR14. Transfer gates TG12 and TG13 are turned on by a control signal CWEN, which is preferably externally applied, and its inverse to store output signals from the inverters INT20 and INT21 to corresponding cells. An inverter INT22 generates the inverse of the control signal CWEN. Operations of the preferred embodiments of a semiconductor memory device in accordance with the present invention will now be described. Each of the cases where power supply voltage sensing part 31b determines that the power supply voltage attains a high or low level will be described.

FIGS. 4A–4E are diagrams showing timing charts of the preferred embodiments of the semiconductor memory device where the power supply voltage attains a low level and a point of disabling the signal WCD is delayed. As shown in FIG. 3 and FIGS. 4A–4E, the power supply voltage sensing part 31b attains a high level on application of write enable signal WET from pad PAD. Thus, the WCD signal generating part 31c produces an output signal whose point of disabling the signal WCD is delayed. As described above, once the power supply voltage sensing part 31b attains a high level, the power supply voltage Vcc goes "low".

If the signal WCD is disabled, the corresponding word line becomes enabled, and when comparing the point of disabling the signal WCD to the point of enabling the word line, its interval is reduced. As a result, a write recovery time TWR is delayed by delaying the point of disabling signal WCD in case of the low-level power supply voltage, thus compensating for the write pulse width time (TWP).

FIGS. 4F–4J are diagrams showing timing charts of the preferred embodiments of the semiconductor memory device when the power supply voltage attains a high level. When the power supply voltage attains a high level, the WET delay 31a is disabled so the point of disabling the signal WCD is not delayed and the write recovery time is maintained the same.

If power supply voltage sensing part 31b senses that the power supply voltage attains a high level, it produces a low-level signal. Since the output signal of power supply voltage sensing part 31b goes "low", the transfer gate TG11 cannot be turned on. Accordingly, a delayed output signal of the WET delay 31a is not applied to the WCD signal generating part 31c, and the signal WET from pad PAD is directly applied to WCD signal generating part 31c. That is, when the power supply voltage attains a high level, the signal WCD is not delayed but normally applied to the WCDN generating part 33.

The WCDN generating part 33 outputs the control signal WCDN to data input part 35 upon application of the chip selection signal CS and the signal WCD. Thus, the data input part 35 outputs a logical product of the signal WCDN and a data signal DATA, and writes the data DATA and the inverted data DATAB to a selected cell.

Figure 5A:
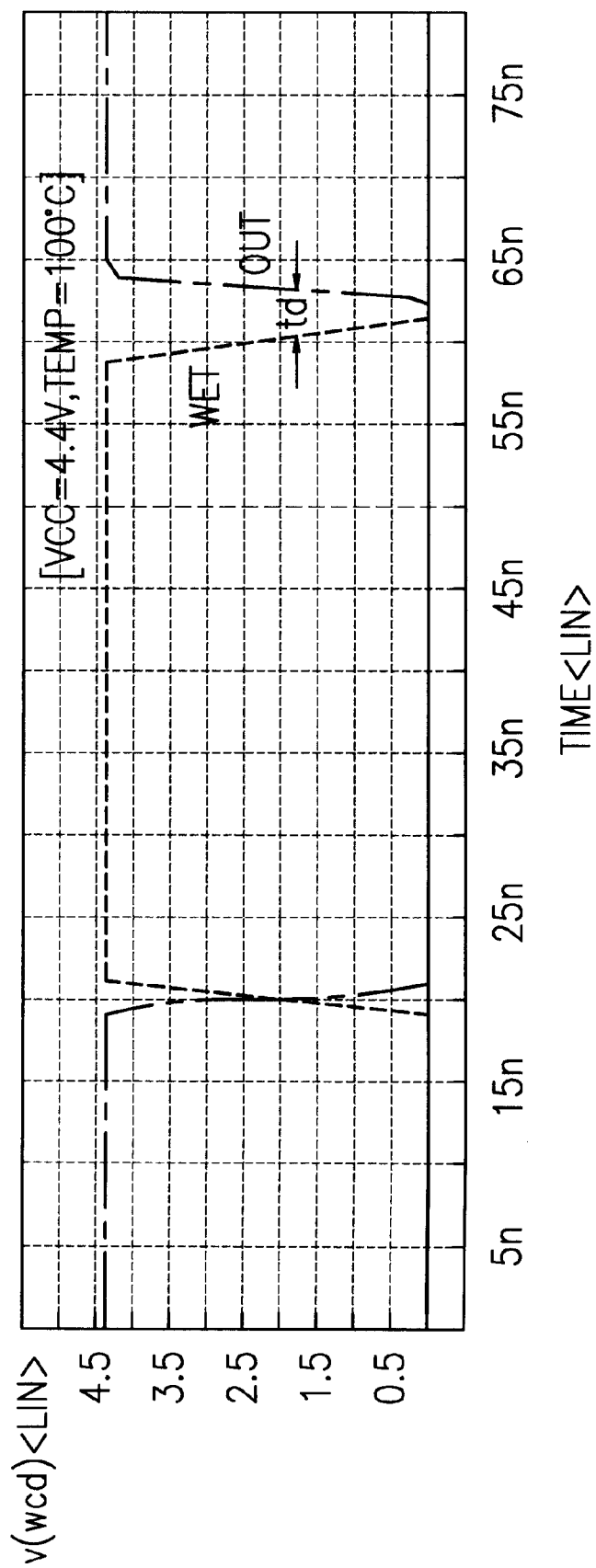
FIGS. 5A and 5B are diagrams showing write pulse width time compensation according to the semiconductor memory device of FIG. 3.
Figure 5B:
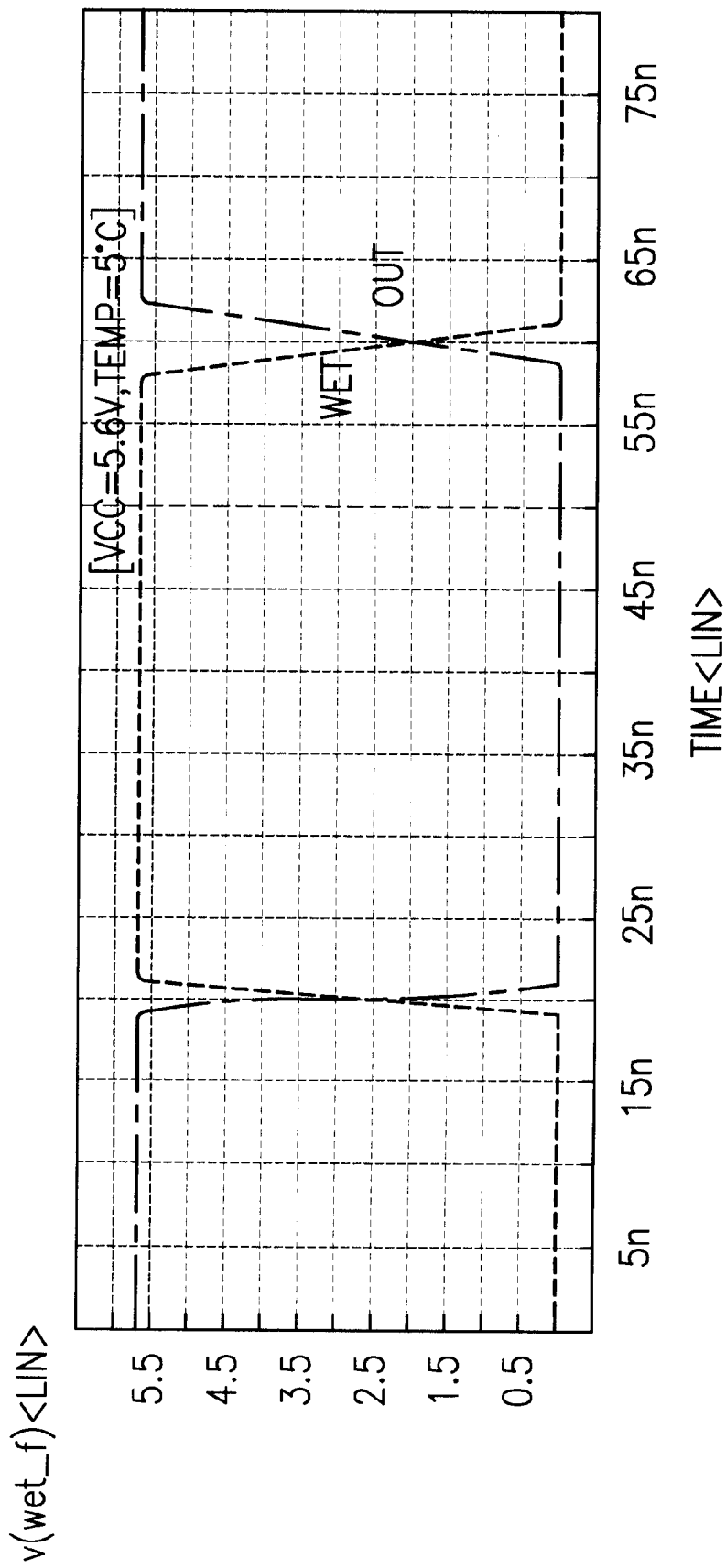

FIGS. 5A and 5B graphically depict simulation results of the preferred embodiment of the semiconductor memory device. FIG. 5A depicts a write pulse width time compensation in the case of the low-level power supply voltage, and FIG. 5B shows a write pulse width time compensation in the case of the high-level power supply voltage. As shown in FIGS. 5A and 5B, the write recovery time TWR is delayed at the low-level power supply voltage so that the memory device performs the same operation as the memory performance at the high-level supply voltage. The memory device implements the normal operation at the high-level power supply voltage to compensate for the write pulse width time TWP.

As described above, the preferred embodiments of the semiconductor memory device according to the present invention has various advantages. The power supply voltage sensing part senses the level of the power supply voltage, and if the power supply voltage attains a low level, the write recovery time is delayed. In case of the high-level power supply voltage, the write recovery time is not delayed. Thus, the write pulse width time characteristics are more accurate and the semiconductor memory device can operate more efficiently.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. It is intended that the present invention cover the modifications and variations of this invention that are within the scope of the appended claims and their equivalents.

What is claimed is:

1. A semiconductor device, comprising:
    a write pulse width compensating circuit that compensates a write enable signal based on a power supply voltage to output a write control drive signal;
    a first generating circuit that receives the write control drive signal, a first selection signal and a second selection signal and outputs a control signal for a selected cell; and
    a data input circuit that receives data and writes the data to the selected cell based on application of the data and the control signal, wherein a transition edge of the write enable signal transits at a different point of time from a transition edge of the write control drive signal when the power supply voltage is a first prescribed level, and the transition edge of the write enable signal transits substantially at a same time as the transition edge of the write control drive signal when the power supply voltage is a second prescribed level.

2. The semiconductor device of claim 1, wherein the write pulse width compensating circuit delays the transition of the write control drive signal compared to the write enable signal when the power supply voltage is the first prescribed level.

3. The semiconductor device of claim 2, wherein the first prescribed level is a low level.

4. The semiconductor device of claim 1, wherein the write pulse width compensating circuit directly produces the write control drive signal when the power supply voltage is the second prescribed level.

5. The semiconductor device of claim 1, wherein the first selection signal is a chip selection signal that identifies a selected cell, wherein the second selection signal is a Z-decoder signal, wherein the control signal is a write data control signal, and wherein the semiconductor memory device compensates a write signal for delays generated by the power supply.

6. The semiconductor device of claim 1, wherein said write pulse width compensating circuit comprises:
    a write enable delay circuit that receives a write enable signal and outputs the delayed write enable signal;

a voltage sensing circuit that senses the power supply voltage and outputs a delay selection signal; and a second generating circuit that receives the delayed write enable signal, the write enable signal and the delay selection signal and produces the write control drive signal.

7. The semiconductor device of claim 6, further comprising a pad that outputs the write enable signal, and wherein the write enable delay circuit comprises a plurality of inverters.

8. The semiconductor device according to claim 6, wherein the voltage sensing circuit produces a high-level signal if the power supply voltage attains a low level and generates a low-level signal if the power supply voltage attains a high level.

9. The semiconductor device of claim 6, wherein the write enable delay circuit outputs the delayed write enable signal only when the delay selection signal of the voltage sensing circuit attains a high level.

10. The semiconductor device of claim 6, wherein the voltage sensing circuit comprises:

first, second, third and fourth transistors coupled in series to the power supply voltage;

a first logic circuit that logically processes a chip enable signal;

a fifth transistor having a control electrode that receives an output signal of the first logic circuit and a second electrode that receives the power supply voltage;

a sixth transistor having a second electrode coupled to a first electrode of the fifth transistor and a control electrode that receives an output signal of the fourth transistor;

a seventh transistor coupled in series with the sixth transistor with a control electrode that receives the output signal of the fourth transistor; and an eighth transistor coupled in series to the seventh transistor having a first electrode coupled to a ground voltage and a control electrode that receives the chip enable signal.

11. The semiconductor device of claim 10, wherein the first, second, third, fourth, seventh and eighth transistors are NMOS transistors, the fifth and sixth transistors are PMOS transistors, the first logic gate is an inverter, and wherein the control, first and second electrodes are respectively a gate, source and drain electrodes.

12. The semiconductor device of claim 6, wherein the second generating circuit comprises:

a first transistor with a control electrode receiving a chip enable signal and a second electrode coupled to the power supply voltage;

a transfer gate enabled by an output signal of the voltage sensing circuit;

an second transistor with a control electrode that receives the power supply voltage and a first electrode coupled to a ground voltage;

a first logic gate that logically processes the write enable signal and an output signal of the transfer gate, wherein the output signal of the transfer gate is regulated by the second transistor;

a delay circuit coupled in series to an output terminal of the first logic-gate to delay an output signal of the first logic-gate; and a second logic-gate that logically processes an output signal of the first logic-gate and an output signal of the delay circuit to output the write control drive signal.

13. The semiconductor device of claim 1, wherein the write pulse width compensating current lengthens the write control drive signal when the power supply voltage is the first prescribed level to be longer than the write control drive signal when the power supply voltage level is the second prescribed level.

14. The semiconductor device of claim 1, wherein the transition edge of the write control drive signal from a high level to a low level is delayed for a prescribed time compared to the transition edge of the write enable signal from a high level to a low level when the power supply voltage is the first prescribed level.

15. The semiconductor device of claim 14, wherein the first prescribed level is a low voltage.

16. The semiconductor device of claim 1, wherein the transition edge of the write control signal from a high level to a low level is substantially about the same time as the transition edge of the write enable signal from a high level to a low level when the power supply voltage is the second prescribed level.

17. The semiconductor device of claim 16, wherein the second prescribed level is a high voltage.

18. The semiconductor device of claim 1, wherein the first prescribed level is a discrete voltage level, which is different from the second prescribed voltage of a different discrete voltage.

19. A write pulse width compensating circuit, comprising:

a write enable delay circuit that receives a write enable signal and outputs a delayed write enable signal;

a voltage sensing circuit that determines a power supply voltage and outputs a delay selection signal; and a generating circuit that receives the delayed write enable signal, the write enable signal and the delay selection signal and produces a write control drive signal based on the power supply voltage, wherein a transition edge of the write enable signal transits at a different point of time from a transition edge of the write control drive signal when the delay selection signal indicates the power supply voltage to be a first prescribed level, and the transition edge of the write enable signal transits substantially at a same time as the transition edge of the write control drive signal when the delay selection signal indicates the power supply voltage to be a second prescribed level.

20. The write pulse width compensating circuit of claim 19, further comprising a pad that outputs the write enable signal, wherein the generating circuit delays the write control drive signal when the power supply voltage is a low level, and wherein the write enable delay circuit comprises a plurality of inverters.

21. The write pulse width compensating circuit of claim 19, wherein the voltage sensing circuit produces a high-level signal when the power supply voltage transitions low level and generates a low-level signal when the power supply voltage transitions high level.

22. The write pulse width compensating circuit of claim 19, wherein the voltage sensing circuit comprises:

first, second, third and fourth transistors coupled in series to the power supply voltage;

a first logic gate that logically processes a chip enable signal;

a fifth transistor having a control electrode that receives an output signal of the first logic gate and a second electrode that receives the power supply voltage;

a sixth transistor having a second electrode coupled to a first electrode of the fifth transistor and a control electrode that receives an output signal of the fourth transistor;

a seventh transistor coupled in series with the sixth transistor with a control electrode that receives the output signal of the fourth transistor; and an eighth transistor coupled in series to the seventh transistor having a first electrode coupled to a ground voltage and a control electrode that receives the chip enable signal.

23. The write pulse width compensating circuit of claim 19, wherein the generating circuit comprises:

a first transistor with a control electrode receiving a chip enable signal and a second electrode coupled to the power supply voltage;

a transfer gate enabled by an output signal of the voltage sensing circuit;

an second transistor with a control electrode that receives the power supply voltage and a first electrode coupled to a ground voltage;

a first logic gate that logically processes the write enable signal and an output signal of the transfer gate, wherein the output signal of the transfer gate is regulated by the second transistor;

a delay circuit coupled in series to an output terminal of the first logic-gate to delay an output signal of the first logic-gate; and a second logic-gate that logically processes an output signal of the first logic-gate and an output signal of the delay circuit to output the write control drive signal.

24. The write pulse width compensating circuit of claim 19, wherein the transition edge of the write control drive signal from a high level to a low level is delayed for a prescribed time compared to the transition edge of the write enable signal from a high level to a low level when the power supply voltage is the first prescribed level.

25. The write pulse width compensating circuit of claim 24, wherein the first prescribed level is a low voltage.

26. The write pulse width compensating circuit of claim 19, wherein the transition edge of the write control signal from a high level to a low level is substantially about the same time as the transition edge of the write enable signal from a high level to a low level when the power supply voltage is the second prescribed level.

27. The write pulse width compensating circuit of claim 26, wherein the second prescribed level is a high voltage.

28. The write pulse width compensating circuit of claim 19, wherein the first prescribed level is a discrete voltage level, which is different from the second prescribed voltage of a different discrete voltage.

29. A semiconductor device, comprising:

a write pulse width compensating circuit that compensates a write control drive signal based on a power supply voltage;

a first generating circuit that receives the write control drive signal, a first selection signal and a second selection signal and outputs a control signal for a selected cell; and a data input circuit that receives data and writes the data to the selected cell based on application of the data and the control signal, wherein said write pulse width compensating circuit includes a voltage sensing circuit that senses the power supply voltage and said voltage sensing circuit includes first, second, third and fourth transistors coupled in series to the power supply voltage, a first logic circuit that logically processes a chip enable signal, a fifth transistor having a control electrode that receives an output signal of the first logic circuit and a second electrode that receives the power supply voltage, a sixth transistor having a second electrode coupled to a first electrode of the fifth transistor and a control electrode that receives an output signal of the fourth transistor, a seventh transistor coupled in series with the sixth transistor with a control electrode that receives the output signal of the fourth transistor, and an eighth transistor coupled in series to the seventh transistor having a first electrode coupled to a ground voltage and a control electrode that receives the chip enable signal.

30. The semiconductor device of claim 29, wherein said write pulse width compensating circuit further comprises:

a write enable delay circuit that receives a write enable signal and outputs a delayed write enable signal; and a second generating circuit that receives the delayed write enable signal, the write enable signal and a delay selection signal based on the power supply voltage sensed by the voltage sensing circuit and produces the write control drive signal.

31. A write pulse width compensating circuit, comprising:

a write enable delay circuit that receives a write enable signal and outputs a delayed write enable signal;

a voltage sensing circuit that determines a power supply voltage and outputs a delay selection signal; and a generating circuit that receives the delayed write enable signal, the write enable signal and the delay selection signal and produces a write control drive signal based on the power supply voltage, wherein the voltage sensing circuit includes first, second, third and fourth transistors coupled in series to the power supply voltage, a first logic gate that logically processes a chip enable signal, a fifth transistor having a control electrode that receives an output signal of the first logic gate and a second electrode that receives the power supply voltage, a sixth transistor having a second electrode coupled to a first electrode of the fifth transistor and a control electrode that receives an output signal of the fourth transistor, a seventh transistor coupled in series with the sixth transistor with a control electrode that receives the output signal of the fourth transistor, and an eighth transistor coupled in series to the seventh transistor having a first electrode coupled to a ground voltage and a control electrode that receives the chip enable signal.

32. A semiconductor device, comprising:

a write pulse width compensating circuit that compensates a write control drive signal based on a power supply voltage;

a first generating circuit that receives the write control drive signal, a first selection signal and a second selection signal and outputs a control signal for a selected cell; and a data input circuit that receives data and writes the data to the selected cell based on application of the data and the control signal, wherein said write pulse width compensating circuit includes a write enable delay circuit that receives a write enable signal and outputs a delayed write enable signal, a voltage sensing circuit that senses the power supply voltage and outputs a delay selection signal, and a second generating circuit that receives the delayed write enable signal, the write enable signal and the delay selection signal and produces the write control drive signal, and wherein the second generating circuit includes
- a first transistor with a control electrode receiving a chip enable signal and a second electrode coupled to the power supply voltage,
- a transfer gate enabled by an output signal of the voltage sensing circuit,
- an second transistor with a control electrode that receives the power supply voltage and a first electrode coupled to a ground voltage,
- a first logic gate that logically processes the write enable signal and an output signal of the transfer gate, wherein the output signal of the transfer gate is regulated by the second transistor,
- a delay circuit coupled in series to an output terminal of the first logic-gate to delay an output signal of the first logic-gate, and
- a second logic-gate that logically processes an output signal of the first logic-gate and an output signal of the delay circuit to output the write control drive signal.

33. A write pulse width compensating circuit, comprising:
a write enable delay circuit that receives a write enable signal and outputs a delayed write enable signal;
a voltage sensing circuit that determines a power supply voltage and outputs a delay selection signal; and
a generating circuit that receives the delayed write enable signal, the write enable signal and the delay selection signal and produces a write control drive signal based on the power supply voltage, wherein the generating circuit includes
- a first transistor with a control electrode receiving a chip enable signal and a second electrode coupled to the power supply voltage,
- a transfer gate enabled by an output signal of the voltage sensing circuit,
- an second transistor with a control electrode that receives the power supply voltage and a first electrode coupled to a ground voltage,
- a first logic gate that logically processes the write enable signal and an output signal of the transfer gate, wherein the output signal of the transfer gate is regulated by the second transistor,
- a delay circuit coupled in series to an output terminal of the first logic-gate to delay an output signal of the first logic-gate, and
- a second logic-gate that logicallyprocesses an output signal of the first logic-gate and an output signal of the delay circuit to output the write control drive signal.

* * * * *